United States Patent [19]

Auger

[11] Patent Number: 4,775,986
[45] Date of Patent: Oct. 4, 1988

[54] DPCM DECODING CIRCUIT FOR DIGITAL SAMPLES

[75] Inventor: Robert Auger, Paris, France

[73] Assignee: U.S. Philips Corporation, New York, N.Y.

[21] Appl. No.: 12,973

[22] Filed: Feb. 10, 1987

[30] Foreign Application Priority Data

Feb. 14, 1986 [FR] France ................... 86 02026

[51] Int. Cl.⁴ .............................................. H04B 14/06
[52] U.S. Cl. ................................... 375/27; 332/11 D; 358/135
[58] Field of Search ................ 375/27, 28, 30, 31; 358/11, 13, 135, 132, 138; 332/11 D

[56] References Cited

U.S. PATENT DOCUMENTS

| 4,292,651 | 9/1981 | Kretz et al. | 375/27 |
| 4,363,103 | 12/1982 | Richard et al. | 375/27 |
| 4,438,452 | 3/1984 | Powers | 358/13 |
| 4,449,143 | 5/1984 | Dischert et al. | 358/11 |
| 4,568,963 | 2/1986 | Sakai et al. | 358/11 |
| 4,574,383 | 3/1986 | Irie et al. | 332/11 D |

Primary Examiner—Robert L. Griffin
Assistant Examiner—Stephen Chin
Attorney, Agent, or Firm—Gregory P. Gadson

[57] ABSTRACT

A decoding circuit for digital samples defining N points of an initial digital signal coded into p bits transmitted by a transmitter by means of differential pulse code modulation (DPCM) into r bits for application in picture display and picture fading devices. It is characterised in that it contains DPCM decoding devices which effect, from received digital samples in accordance with a clock H1 having a period T1 in a single interpolation and transcoding arrangement, the combination of a transcoding and a linear interpolation obtained by a division of the absolute difference da between two initial samples by a number n in order to provide transcoded and divided digital samples dad (where dad=-da/n) which are processed in an adder at a rate which is higher than the transcoding rate determined by a clock H2 having a period T2 such that T2=T1/n in which n is a positive even number in order to recover M points of the decoded DPCM signal in which M is higher than N, the supplementary points being obtained by linear interpolation.

5 Claims, 2 Drawing Sheets

DPCM DECODING CIRCUIT FOR DIGITAL SAMPLES

BACKGROUND OF THE INVENTION

The invention relates to a decoding circuit for digital samples defining N points of an initial signal transmitted by a transmitter by means of differential pulse code modulation DPCM at a rate determined by a clock H1 and each defining the absolute difference $\overline{da}$ encoded into p bits between two consecutive samples of the initial signal which digital samples are transcoded into r bits, where r is smaller than p.

This decoding circuit is used in receiver stages processing digital data stored in bulk memories or transmitted through radio channels.

A decoding circuit of this type is known from the book "Digital processing of speech signals" by L. R. Rabiner, R. W. Schafer, Prentice-Hall Inc Englewood Cliffs, New-Jersey, pages 208 etc. Differential pulse code modulation (DPCM) is a digital coding technique in which the difference of the values between two digitally coded adjacent samples are used for storage or for transmission. DPCM coding may thus be considered as a prediction coding in which the difference between a given value and a prediction is used. The variations between two successive digital data coded into q bits are determined and then represented by values transmitted in the form of digital samples which are transcoded in p bits where p is smaller than q in order to reduce the rate of digital information which is required for transmission.

The receiver circuit effects the inverse transformation, that is to say that it successively adds the value represented by the received digital samples $\overline{da}$ to the previously determined value. These samples $\overline{da}$ are encoded such that at the receiver stage the decoding circuit includes a transcoding member followed by an adder whose output is coupled to one of its inputs, the assembly operating at the same rate as that defined upon transmission.

The receiver must thus first reconstruct the signal after it has been filtered in order to render it usable. This involves a given complexity and necessitates a large number of logic functions particularly for filtering. The number of logic layers used at each operation leads to a given limitation of the working rate of the decoding circuit.

The initial signal which is defined by N points upon transmission is also obtained at N points upon reception after decoding. Generally this signal is subsequently smoothed by means of filtering for eliminating irregularities in restoring the signal. For treating digital signals it has been proposed to increase the restoring rate of output samples by generating supplementary samples. This is realized, for example in the document GB Pat. No. 2,078,406 but with different signals such as PCM signals. This document describes a linear interpolator based on a recursive filter structure and on a divide by N circuit in which the output of the interpolator operates at a rate which is N times higher than that of the input. But the circuit described is not used for DPCM signals at all.

The applications in which DPCM coding is used utilize the fact that this type of coding permits of considerably reducing the digital rate to be transmitted without degrading the restored signal to a too great extent, which is very important in the case of bulk memories or in radio channel transmission.

SUMMARY OF THE INVENTION

An object of the invention is to adapt the linear interpolation to the processing of DPCM signals by combining the transcoding and filtering operations. It also ensures a larger speed by reducing the number of logic layers used for recovery of the receiver signal.

Another object of the invention is to reduce the crystal surface required for realizing an integrated circuit constituting the decoding circuit by decreasing the number of layers and thus logic functions.

To this end the invention as described in the opening paragraph is characterized in that the decoding circuit comprises DPCM decoding means which effect, from transcoded digital samples received in accordance with a clock H1 having a period T1 in a unique transcoding and interpolation arrangement, the combination of a transcoding and a linear interpolation obtained by effecting inverse transcoding and by generating digital samples obtained by dividing the absolute difference $\overline{da}$ by a number n in order to supply transcoded and divided digital samples dad=da/n which are processed in an adder at a rate which is higher than the transcoding rate determined by a clock H2 having a period T2 such as T2=T1/n, where n is an even number which is higher than 1 in order to recover M points of the decoded DPCM signal, where M is higher than N, the supplementary points being obtained by linear interpolation.

It is known that for obtaining a correct recovery of a signal it is necessary to sample it at a rate which has a low limit associated with the maximum frequencies to be transmitted, that is to say at the passband of the signal. For this minimum sampling frequency the minimum number of samples theoretically permits of recovering the initial signal. The signal thus recovered is subsequently filtered. It is proposed in the invention to realize the filtering operation by effecting a linear interpolation between two digital samples which are received consecutively, which interpolation is carried out during the actual DPCM decoding operation in order to continuously add an incremental value. According to the invention this incremental value is determined by the interpolation factor used. This factor determines the ratio of the periods T1 and T2 of the clocks H1 at the transmitter end and H2 at the final stage of the decoding circuit. This ratio is, for example T2=T1/n in which n is higher than 1. As the incremental values transmitted by the transmitter are $\overline{da}$, the incremental values continuously added during each period T2 will be equal to dad=da/n. The loop thus adds for each period T1 n times the value da/n and subsequently adds for the following period T1 n times another value da/n in accordance with:

sequence($i-1$) of duration $T1$ $X(i-1, 0) + dad(i-1) = X(i-1, 1)$ $X(i-1, 1) + dad(i-1) = X(i-1, 2)$ $X(i-1, n) + dad(i-1) = X(i, 0)$ sequence $i$ of duration $T1$ $X(i, 0) + dad(i) = X(i-1)$ -continued $$X(i, n) + dad(i) = X(i + 1, 0).$$

In order to carry out all these operations successively, it is necessary to temporarily store the digital samples in bistable multivibrators.

The circuit according to the invention thus has DPCM decoding means which comprise:

a bistable multivibrator B1 (11 in FIG. 2) which stores the received DPCM samples under the control of the clock H1 and transmits them to the transcoding and interpolation arrangement which supplies transcoded and divided samples to a bistable multivibrator B2 (13 in FIG. 2) controlled by a clock H3 having a period T1 and being delayed with respect to H1, an adder which receives at a first input the data from the bistable multivibrator B2 and supplies its result to a bistable multivibrator B3 (14 in FIG. 2) controlled by a clock H2 which transmits its data to the second input of the adder in accordance with a loop configuration, the output of the adder being connected to a bistable multivibrator B4 (16 in FIG. 2) controlled by a clock H4 having a period T2 and being delayed with respect to H2 which supplies the decoded DPCM signal.

The digital samples $\overline{da}$ are coded into p bits and then transcoded into r bits in order to be transmitted to the decoding circuit, r being smaller than p. The transcoding and interpolation arrangement according to the invention generates samples having an amplitude $dad = da/n$ which must be coded into a number which is higher than p bits in order to ensure a sufficient precision during operation. This number of bits is equal to (p+s), that is to say, s bits are added, with s being defined as the first power of 2 so that n is smaller than or equal to $2^s$.

BRIEF DESCRIPTION OF THE DRAWINGS

The invention will now be described in greater detail with reference to the accompanying drawings in which.

DETAILED DESCRIPTION OF THE INVENTION

Figure 1:
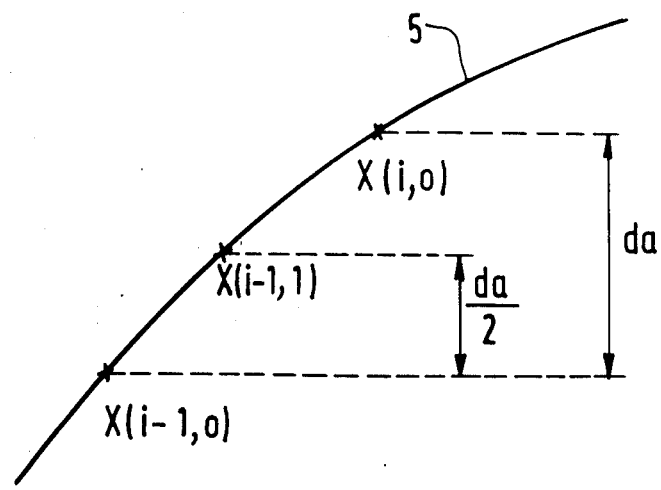
FIG. 1 shows the decoding and intepolation method according to the invention.

FIG. 1 illustrates the method of decoding and interpolation according to the invention. A signal to be recovered is represented by a curve 5. By using, after decoding, the digital samples $\overline{da}$ present at the output of the decoding circuit, the points of the curve $X(i-1, 0)$, $X(i, 0)$, ... are recovered by successive additions. The decoding circuit according to the invention permits of determining intermediate points, for example a point $X(i-1, 1)$ in the case of FIG. 1 with n=2 or more generally $n-1$ intermediate points $X(i-1, n-1)$.

Figure 2:
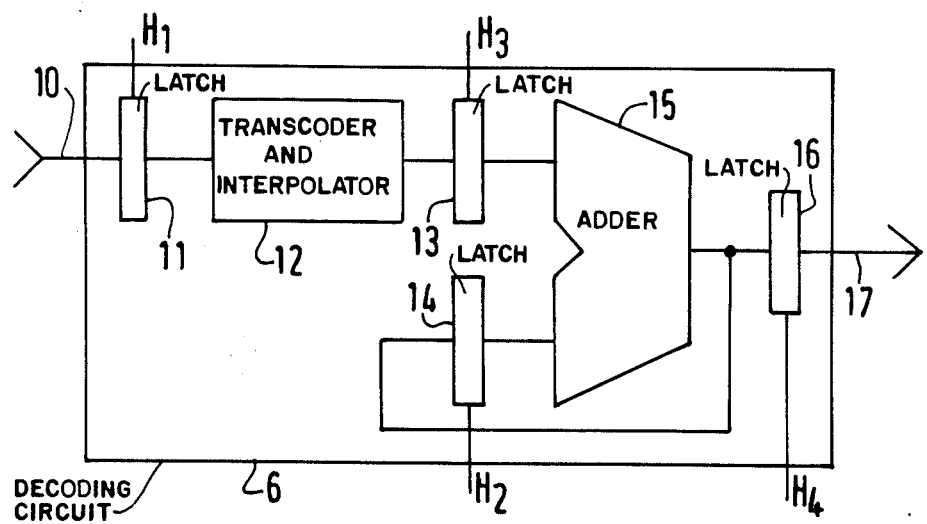
FIG. 2 is a block schematic diagram of the decoding circuit according to the invention.

The block schematic diagram of the decoding circuit 6 is shown in FIG. 2. It comprises a bistable multivibrator B1 11 which stores, under the control of the clock H1, the codes of the transcoded digital samples $\overline{da}$ which are present at the connection 10 and are coded into r bits. These codes are entered into a transcoding and interpolation arrangement 12 which supplies the transcoded and divided samples of the value da/n at the output. This transcoding and interpolation may be effected, for example with the aid of a read-only memory in which the codes of the transcoded samples $\overline{da}$ are utilized as addresses for reading the previously stored samples da/n. It may also be effected by a random access memory or a programmable logic network. The transcoding and interpolation may be effected, for example in the following manner:

| values of the difference of the signal | code transmitted | recovered values | value dad (n = 2) |
|---|---|---|---|
| 0–2 | 0 | 1 | 0.5 |
| 3–6 | 1 | 4 | 2.0 |
| 7–12 | 2 | 9 | 4.5 |
| 13–21 | 3 | 16 | 8.0 |
| 22–35 | 4 | 27 | 13.5 |
| 36–61 | 5 | 44 | 22 |
| 62–99 | 6 | 79 | 39.5 |
| 100–255 | 7 | 120 | 60 |
| −(1–2) | 8 | −1 | −0.5 |
| −(3–6) | 9 | −4 | −2.0 |
| −(7–12) | 10 | −9 | −4.5 |
| −(13–21) | 11 | −16 | −8.0 |
| −(22–35) | 12 | −27 | −13.5 |
| −(36–61) | 13 | −44 | −22 |
| −(62–99) | 14 | −79 | −39.5 |
| −(100–255) | 15 | −120 | −60 |

Each sample dad=da/n is stored in a latch circuit B2 13 controlled by the clock H3 during the period T1. The output of the latch circuit B2 13 is connected to one of the inputs of an adder 15 whose output is connected to its second input via a latch circuit B3 14 controlled by a clock H2 which supplies a value Si. The output of the adder 15 is also connected to a latch circuit B4 16 controlled by the clock H4 which supplies the final result $Si+dad_i$ to the connection 17 with (p+s) bits.

The latch circuit 11 and 13 thus store their data during each period T1 and the latch circuit 14 and 16 store their data during each period T2.

Figure 3:
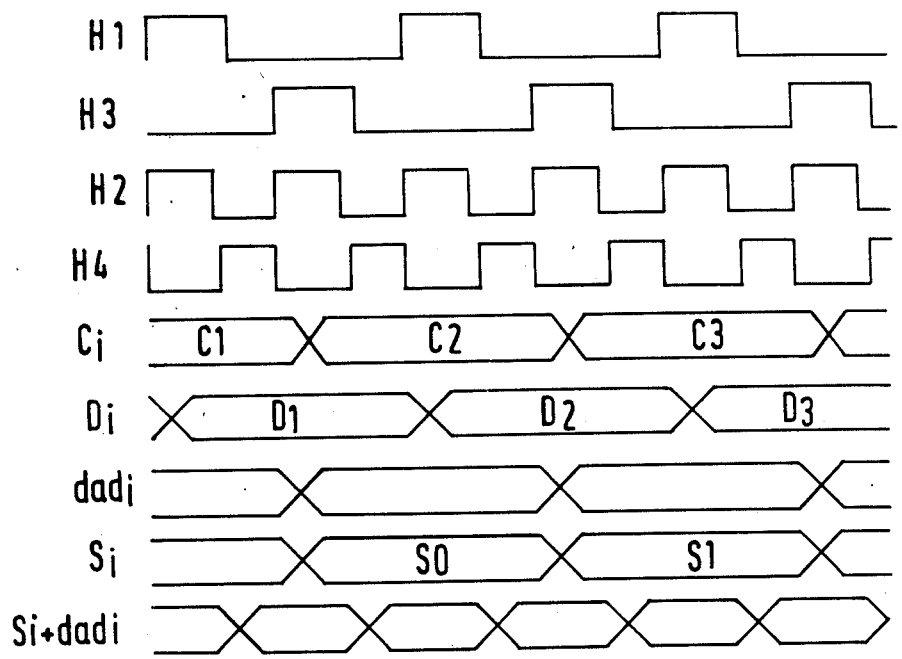
FIG. 3 is a time diagram for a decoding circuit with n=2.

FIG. 3 shows the time diagram in the case in which the interpolation factor is equal to 2. The clock H2 thus has a period T2 which is twice shorter than the period T1 of the clock H1. The received digital sample codes Ci are stored, for example during the rising edge of the clock H1 in accordance with the samples Di. These are transcoded and stored in accordance with the samples $dad_i$ during the rising edge of H3. The samples Si are stored in the rising edge of H2 and the result $Si+dad_i$ is supplied to the rising edge of H4.

The decoding circuit according to the invention is used for processing luminance signals Y and color difference signals R–Y and B–Y in accordance with a television standard. For this purpose three decoding circuits according to the invention simultaneously process these signals. This is utilized in digitally coded picture display devices used, for example in home computers or other computer types. They may also be used in any picture display device or in any audio device using DPCM decoding.

Figure 4:
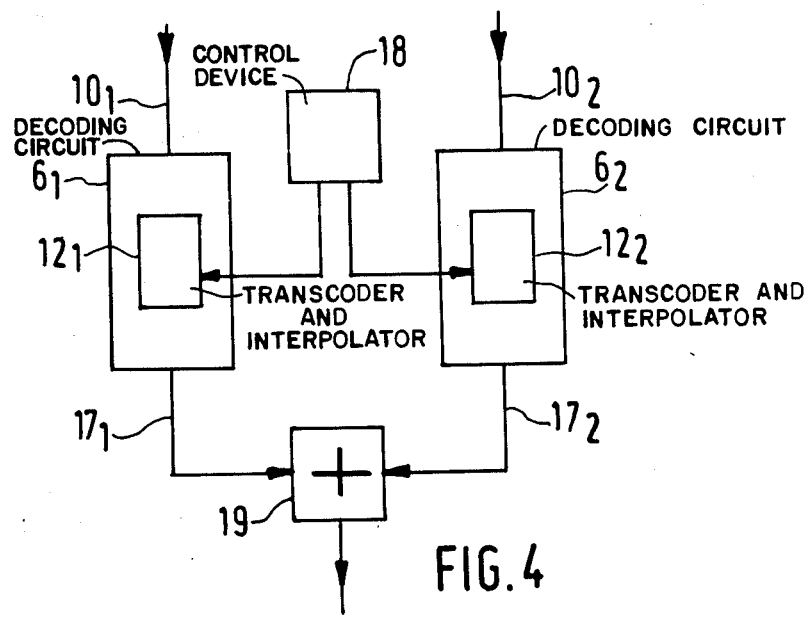
FIG. 4 shows a diagram of a fading circuit comprising two decoding circuits according to the invention.

FIG. 4 shows the diagram of a picture fading circuit comprising two decoding circuits according to the invention.

The signals from two different images which are desired to be successively represented by fading them arrive at the input connections $10_1$ and $10_2$ and are applied to the decoding circuits $6_1$ and $6_2$. In a first fading method, the transcoding arrangements $12_1$ and $12_2$ supply the values da/n altered by attenuation coefficients k and 1−k, respectively. During the time when fading must be effected the coefficients k and 1−k are modified from 1 to 0 for k and simultaneously from 0 to 1 for 1−k. This is obtained by using random access memories as transcoding and interpolation arrangements $12_1$ and $12_2$ which are regularly recharged with values modified each time by the new coefficients k and 1−k by a control device 18.

In accordance with another method the transcoding and interpolation arrangements $12_1$ and $12_2$ are programmable logic networks supplying the modified values selected by the control device 18.

In accordance with these two methods the data supplied by the circuits $6_1$ and $6_2$ are added in an adder 19 which supplies a signal which is equal to the weighted sum of the signals $M_1$ and $M_2$ which are present at the two inputs $10_1$ and $10_2$ in accordance with the equation:

$$s = k.M_1 + (1-k) M_2,$$

the coefficient k varying from picture display to picture display, thus obtaining a fading effect.

I claim:

1. A decoding circuit for digital samples defining N points of an initial signal transmitted by a transmitter by means of differential pulse code modulation (DPCM) at a rate determined by a clock H1 and each defining an absolute difference da encoded into p bits between two consecutive samples of the initial signal which digital samples are transcoded into r bits, where r is smaller than p, characterized in that the circuit comprises DPCM decoding means which effect, from transcoded digital samples received in accordance with a clock H1 having a period T1 in an interpolation and transcoding arrangement, the combination of a transcoding and a linear interpolation obtained by effecting inverse transcoding and by generating digital samples obtained by dividing the absolute difference da by a number n in order to supply transcoded and divided digital samples (dad, in which dad=da/n) which are fed to a first input of an adder having an output coupled to a second input at a rate which is higher than the transcoding rate determined by a clock H2 having a period T2 such that T2=T1/n in which n is an even number which is higher than 1 in order to recover M points of the decoded DPCM signal in which M is higher than N, and supplementary points being obtained by linear interpolation.

2. A circuit as claimed in claim 1, characterized in that the DPCM decoding means comprise:
a latch circuit B1 which stores the received DPCM samples under the control of the clock H1 and transmits them to the transcoding and interpolation arrangement which supplies the transcoded and divided samples to a latch circuit B2 controlled by a clock H3 having a period T1 and being delayed with respect to H1,
said adder which receives at the first input the data from the latch circuit B2 and supplies its result via its output to a latch circuit B3 controlled by a clock H2 which transmits its data to the second input of the adder in accordance with a loop configuration, the output of the adder also being connected to a latch circuit B4 controlled by a clock H4 having a period T2 and being delayed with respect to H2 which supplies the decoded DPCM signal.

3. A circuit as claimed in claim 2, characterized in that the interpolation and transcoding arrangement provides for each digital sample coded into p bits transcoded and divided digital samples dad coded into (p+s bits) with s being defined as the first power of 2 so that n is smaller than or equal to 2 s.

4. A circuit as claimed in claim 3, characterized in that the samples dad are stored in the interpolation and transcoding arrangement which is a read-only memory, a random access memory or a programmable logic network addressed by received transcoded samples.

5. A fading circuit comprising two decoding circuits, as claimed in claim 2 characterized
in a first path at least a first decoding circuit provided with an interpolation and transcoding arrangement which supplies values which is modifiable by a coefficient k,
in a second path at least a second decoding circuit provided with an interpolation and transcoding arrangement which supplies values which are simultaneously modifiable by a coefficient 1−k, while the coefficients k and 1−k are regularly modifiable by a control device between the values 0 and 1 for k and simultaneously between 1 and 0 for 1−k,
and an adder which adds the signals supplied from these two paths to obtain a faded output signal.

* * * * *